(12) United States Patent
Gendrier et al.

(10) Patent No.: US 7,502,985 B2
(45) Date of Patent: Mar. 10, 2009

(54) METHOD OF DETECTING AND CORRECTING ERRORS FOR A MEMORY AND CORRESPONDING INTEGRATED CIRCUIT

(75) Inventors: Philippe Gendrier, Grenoble (FR); Philippe Candelier, Saint Mury Monteymond (FR); Richard Fournel, Lumbin (FR)

(73) Assignee: STMicroelectronics SA, Montrouge (FR)

( * ) Notice: Subject to any disclaimer, the term of this patent is extended or adjusted under 35 U.S.C. 154(b) by 623 days.

(21) Appl. No.: 11/220,515

(22) Filed: Sep. 7, 2005

(65) Prior Publication Data
US 2006/0075320 A1    Apr. 6, 2006

(30) Foreign Application Priority Data
Sep. 10, 2004   (FR) .................................. 04 09650

(51) Int. Cl.
G11C 16/26   (2006.01)
G11C 29/00   (2006.01)

(52) U.S. Cl. ....................... 714/763; 714/773
(58) Field of Classification Search ................. 714/763, 714/773
See application file for complete search history.

(56) References Cited

U.S. PATENT DOCUMENTS

| | | | |
|---|---|---|---|
| 3,623,155 A | 11/1971 | Hsiao et al. ............... 340/146.1 |
| 6,131,177 A * | 10/2000 | Takeuchi et al. ............ 714/767 |
| 6,373,758 B1 | 4/2002 | Hughes et al. .............. 365/200 |
| 6,505,305 B1 * | 1/2003 | Olarig ............................ 714/5 |
| 6,507,518 B2 * | 1/2003 | Hosono et al. ......... 365/185.22 |
| 6,604,222 B1 | 8/2003 | Jensen ......................... 714/785 |
| 6,704,230 B1 * | 3/2004 | DeBrosse et al. ............ 365/201 |
| 6,751,147 B1 * | 6/2004 | Smith et al. ............ 365/225.5 |
| 6,829,167 B2 * | 12/2004 | Tu et al. ................. 365/185.18 |
| 6,868,022 B2 * | 3/2005 | Scheuerlein et al. ........ 365/201 |
| 6,961,890 B2 * | 11/2005 | Smith ......................... 714/763 |
| 7,006,388 B2 * | 2/2006 | Perner et al. ........... 365/189.07 |
| 7,035,137 B2 * | 4/2006 | Iwata et al. ................. 365/158 |
| 7,036,068 B2 * | 4/2006 | Davis et al. ................. 714/763 |
| 7,107,508 B2 * | 9/2006 | Jedwab et al. .............. 714/763 |
| 7,149,948 B2 * | 12/2006 | Davis et al. ................. 714/763 |
| 7,171,594 B2 * | 1/2007 | Wyatt et al. ................. 714/704 |
| 7,210,077 B2 * | 4/2007 | Brandenberger et al. .... 714/708 |
| 7,231,580 B2 * | 6/2007 | Shiota et al. ................ 714/765 |
| 2002/0053062 A1 | 5/2002 | Szymanski .................. 714/801 |
| 2002/0120887 A1 | 8/2002 | Hughes et al. ................ 714/42 |
| 2004/0073829 A1 | 4/2004 | Olarig ............................ 714/6 |

* cited by examiner

Primary Examiner—Stephen M Baker
(74) Attorney, Agent, or Firm—Lisa K. Jorgenson; Allen, Dyer, Doppelt, Milbrath & Gilchrist, P.A.

(57) ABSTRACT

A method is for detecting and correcting errors for a memory storing at least one code block including information data and control data. The method includes reading and decoding each element of the at least one code block to deliver an information item representative of a number of errors in the at least one code block. The method further includes, when the number of errors exceeds one, modifying a parameter of the read by a chosen value, and performing a reading and decoding of the at least one code block again to obtain a new error information item.

30 Claims, 8 Drawing Sheets

METHOD OF DETECTING AND CORRECTING ERRORS FOR A MEMORY AND CORRESPONDING INTEGRATED CIRCUIT

FIELD OF THE INVENTION

The invention relates to the detecting and correcting of errors in the reading of data stored in a memory, such as, for example, a nonvolatile memory of "FLASH/EEPROM" type or of a magnetic memory of MRAM type.

BACKGROUND OF THE INVENTION

The use of error correcting codes is now widespread in memory systems. They are intended to correct defects occurring in the manufacture of circuits by supplementing or replacing the traditional redundancy columns, and to correct defects occurring during the operation of the memory.

For example, dynamic memory circuits (DRAMs) increasingly comprise error correcting code blocks to increase manufacturing yields or to correct errors produced from the alpha particles bombardment that occurs during the life of the product. Nonvolatile memories of the flash/EEPROM type are also increasingly associating their control circuits with error correcting systems, such as in the field of multi-level/bit memories, to increase the data retention characteristics and the reliability of the circuits. Generally, in these applications, the coded data are read and processed by a decoder which provides an indication of the presence of errors and their number, and possibly corrects them, or indicates that correction is not possible.

The complexity of coders/decoders varies from one system to another, but most use the principle of reading and analysis. The correcting circuits used most often in the field of memories make use of Hamming or Reed-Solomon (RS) type linear codes belonging to the family of Bose-Chaudhuri-Hocquenghem (BCH) codes. These codes are characterized by the length of their code blocks. More precisely, these code blocks comprise k data containing the useful information item and r control bits, the sum k+r being equal to n and defining the length of the code block.

The evaluation of the characteristics of the corrector blocks must consider the increase in area introduced by the cells storing the control bits, the area occupied by the coders/decoders, and the delays produced by the passage of the data through these blocks which penalize the memory access times. The integration of the correcting circuits then usually results from a compromise made between these various criteria and the gain in reliability, which does not generally make it possible to integrate overly complex codes.

Industrial fabrication is therefore now gearing towards the integration of codes making it possible to correct an error and to detect two errors. Such detecting and correcting codes are for example those called "SEC-DED" ("Single Error Correction-Double Error Detection") codes. An example of such codes is described in U.S. Pat. No. 3,623,155 to Hsiao et al.

Other codes, of the cyclic redundancy type (CRC: Cyclic Redundancy Code), may sometimes be used. These codes rely on the principle of polynomial division. More precisely, the binary information item to be coded is regarded as a polynomial which, once divided by a definite number, gives a remainder which is coded by the control bits. The best known characteristic polynomials are the CRC16-forward ($x^{16}+x^{15}+x^2+1$) and the CRC-CCITT ($x^{16}+x^{12}+x^5+1$). Although these codes are simple and exhibit a low overhead of area, their drawback is that they only constitute error detection codes and do not perform corrections. Thus, they are intended to be employed for testing memories, which use a specific test circuit integrated during the manufacture of the memory, using an associated test algorithm (known by the person skilled in the art by the name "BIST: Built-In-Self-Test").

In systems using correcting codes of the SEC-DED type, if the number of errors exceeds unity, then correction is not possible and the information item contained in the memory remains erroneous. Moreover, if the number of errors is greater than two, the system is no longer capable of detecting the errors and then provides a false information item. This principle of error detection-correction is well suited to cases for which the errors are due to the deficiency of isolated bits, but is inadequate when the errors originate from a more global drifting of the characteristics of the memory cells or slots.

Additionally, cyclic redundancy codes (of the CRC type), although efficient for error detection, are currently restricted to the field of testing (BIST) in which a single information item, of the "good or bad circuit" type, is sought. These systems therefore appear to be limited and not very robust for use where the degradation of data in a memory occurs during the life of the product.

A few attempts to improve the systems are currently reported in the literature. More precisely, some use a read only memory, such as U.S. Pat. No. 4,163,147 to Greive et al. Other attempts introduce the possibility of correcting two errors with an error correcting code of the SEC-DED type, but only if one of the two errors is a hardware error (hard error), such as in U.S. Pat. No. 4,319,357 to Bossen. Additionally, U.S. Pat. No. 6,657,896 to Hosono et al. proposes a complex circuit for coding a current that is proportional to the number of 1's contained in the information words.

SUMMARY OF THE INVENTION

An object of the invention is to correct and detect errors in memories by using single error correcting codes (for example of the SEC-DED type) or single error detecting only codes (for example, of the CRC type), while improving the total number of possible error corrections. A further object of the invention is to provide such in a device using a small overhead of area and with improved robustness.

The invention includes the combination, in one and the same circuit, of a decoder implementing a decoding of a simple error detecting code, or of a simple error detecting and correcting code, for example of the CRC type and/or of the SEC-DED type, with an analysis of the result obtained for code blocks resulting from reads carried out under various conditions, in particular, but not exclusively, at the level of the reference current used for the reading of the data of these code blocks.

The invention therefore proposes a method of detecting and correcting errors for a memory, in particular a nonvolatile memory of the type with storage by floating gate, or a nonvolatile memory of the magnetic type. The memory stores code blocks comprising information data and control data. The method comprises a reading of each element of a code block. The method further comprises a decoding of the code block thus read to deliver an information item representative of the number of errors in the code block read.

According to one embodiment, in the presence of a number of errors that is greater than one, a) at least one parameter of the read is modified by a chosen value, and b) a read and a decoding of the code block are performed again so as to obtain a new error information item. Phases a) and b) may be iteratively repeated until a final number of errors that is at most equal to one is obtained.

In practice and in the majority of memory architectures, the reading of each element of a code block comprises a comparison of the current delivered by the memory cell storing this element with a reference current, and a consideration of the result of the comparison at a chosen instant of consideration. Thus, according to one embodiment, the read parameter modified is the reference current. More precisely, in step a) the value of the reference current is modified by a chosen notch or amount.

According to another embodiment, the read parameter modified is the instant of consideration, for example, the instant at which the result of the comparison is recorded in a register or a flip-flop. More precisely, according to this embodiment, the instant of consideration is modified by a chosen notch or amount.

It is also possible to combine these two embodiments by modifying the reference current and the instant of consideration. The final number of errors that may consequently be equal to one or to zero, is chosen as a function of the type of code with which the code block has been encoded. More precisely, if the code block is encoded with an error detecting and correcting code, for example a code of the SEC-DED type, then the final number of errors may be chosen equal to 1. Specifically, when the number of errors has been reduced to 1, such a code allows the correction of the residual error by the decoder itself.

On the other hand, if the code block is encoded with an error detecting only code, for example a code of the cyclic redundancy type, then the final number of errors is advantageously chosen equal to zero. In other words, in this case the value of the reference current will be modified until no errors are detected.

In a preferred embodiment, the code block may be encoded with an error detecting only code (for example a code of the CRC type) and then with an error detecting and correcting code (for example of the SEC-DED type). In this case, the successive decodings, if any, are performed with the error detecting and correcting code until a final number of errors that is equal to 1 is obtained, and then the residual error is corrected. The final absence of an error is then advantageously confirmed by a reading of the code block thus corrected, followed by a decoding using the error detecting only code.

An embodiment also provides an integrated circuit comprising a memory for storing code blocks including information data and control data, and a system for detecting and correcting errors that is assigned to this memory, and comprises a reading module or means for reading each element of a code block. The system for detecting and correcting errors additionally comprises a decoder or means of decoding the code block thus read, and which is able to deliver an information item representative of the number of errors in the code block read.

According to a general characteristic, the system for detecting and correcting errors further comprises a drive module or drive means able in the presence of a number of errors that is greater than one, to modify at least one parameter of the reading means by a chosen value, to again activate the means of reading and decoding the code block so as to obtain a new error information item, and to possibly iteratively repeat phases a) and b) until a final number of errors that is at most equal to one is obtained.

According to one embodiment, the reading means comprises a comparator or means of comparison of the current delivered by the memory cell storing this element with a reference current, as well as a recorder or means of recording able to record at a chosen recording instant, the result delivered by the means of comparison, and the drive means are able to modify, as parameter of the reading means, the value of the reference current by a chosen notch or amount.

According to another embodiment, the drive means are able to modify, as parameter of the reading means, the value of the instant of recording by a chosen notch or amount.

According to another embodiment of the invention in which the code block is encoded with an error detecting only code and then with an error detecting and correcting code, the decoding means comprise a first decoder able to perform the successive decodings, if any, with the error detecting and correcting code until a final number of errors which is equal to 1 is obtained, then to correct the residual error. The decoding means then comprises a second decoder able to decode the code block thus corrected and read, with the error detecting only code.

DETAILED DESCRIPTION OF THE PREFERRED EMBODIMENTS

Figure 1:
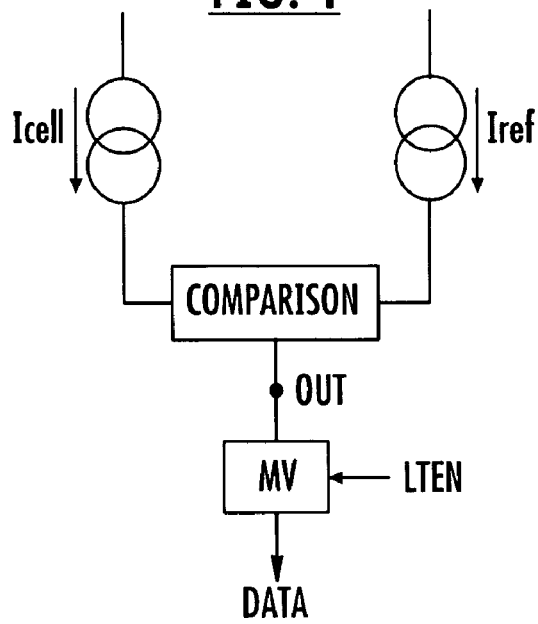
FIG. 1 represents a prior art embodiment of means of reading of a device.

Generally, systems for reading data in memories, in particular nonvolatile ones, compare a reference current Iref with the current Icell delivered by the memory cell read (FIG. 1). The result of the comparison is provided by a voltage on the output node OUT. This voltage controls the value DATA obtained on the output (and representative of the data read), which may be taken into consideration or recorded at any moment in a register or a flip-flop MV in response to a record signal LTEN. Provision is generally made for a precharger or means of precharging the node OUT which stabilizes the voltage of this node at VDD (supply voltage), at GND (ground) or at any other intermediate voltage, outside of the reading periods.

Figure 2:
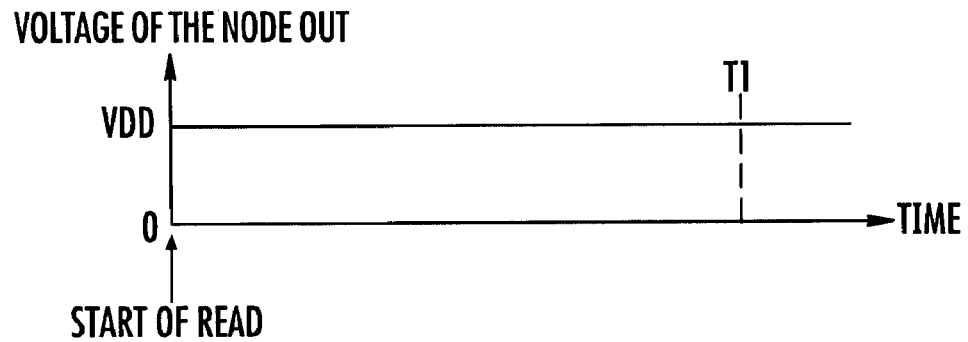
FIG. 2 represents a prior art time profile of the voltage at a node of the means of reading of FIG. 1 in the case of a programmed cell.
Figure 3:
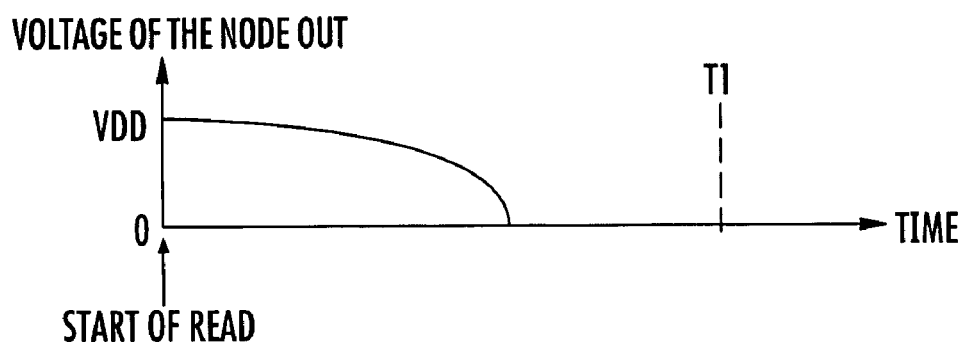
FIG. 3 represents a prior art time profile of the voltage at a node of the means of reading of FIG. 1 in the case of a virgin cell.

The profiles of the voltage on the node OUT, with a means of precharging to VDD, during a reading of a programmed or virgin cell, are presented in FIGS. 2 and 3. FIG. 2 shows that when the current of the memory cell is greater than the reference current Iref, as in the case of a programmed cell containing for example a logic "1", the voltage of the node OUT remains stable. The current Iref is too small with respect to Icell to discharge the node OUT.

On the other hand, when the current delivered by the cell is very low, as in the case of a virgin cell containing for example a logic "0" (FIG. 3), the node OUT discharges in the course of time until it reaches a zero voltage. The duration of discharge depends on the difference between the currents Icell and Iref. To correctly read the data the instant T1 (that is to say the duration of reading) at which the data item is recorded, the reading must be sufficiently late (of a sufficiently long duration) to allow almost complete discharging, if any, of the node OUT. The reference current Iref is adjusted in such a way that it takes an intermediate value LN between the typical currents delivered by a virgin cell and a programmed cell.

Figure 4:
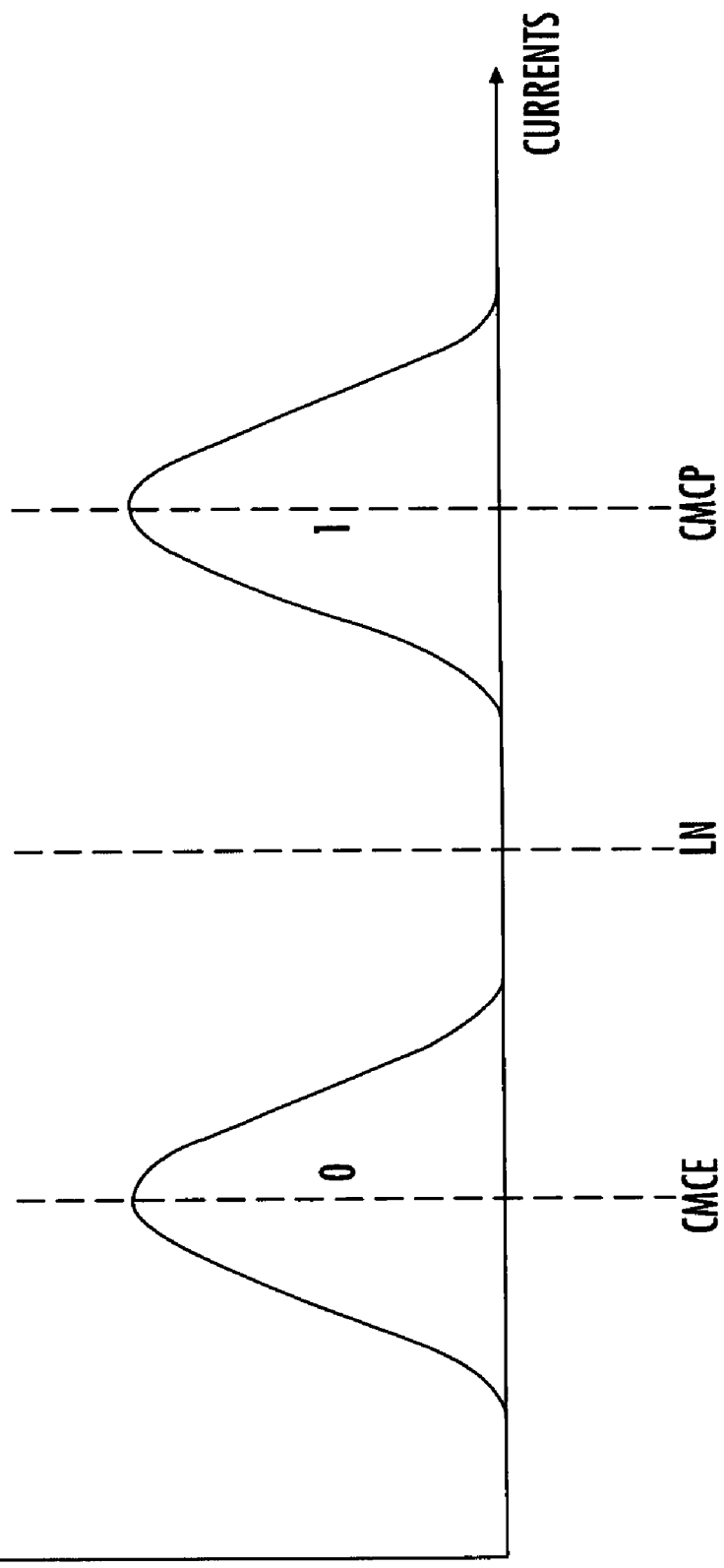
FIG. 4 illustrates a distribution of the currents of the virgin and programmed cells of a memory in accordance with the prior art.

FIG. 4 presents the characteristic results obtained during the reading of the set of cells of a memory for which the numbers of virgin and programmed cells are substantially equivalent. The reference CMCE designates the initial mean current delivered by virgin cells (containing a logic zero) whereas the reference CMCP designates the initial mean current delivered by the programmed cells (containing a logic 1).

Figure 5:
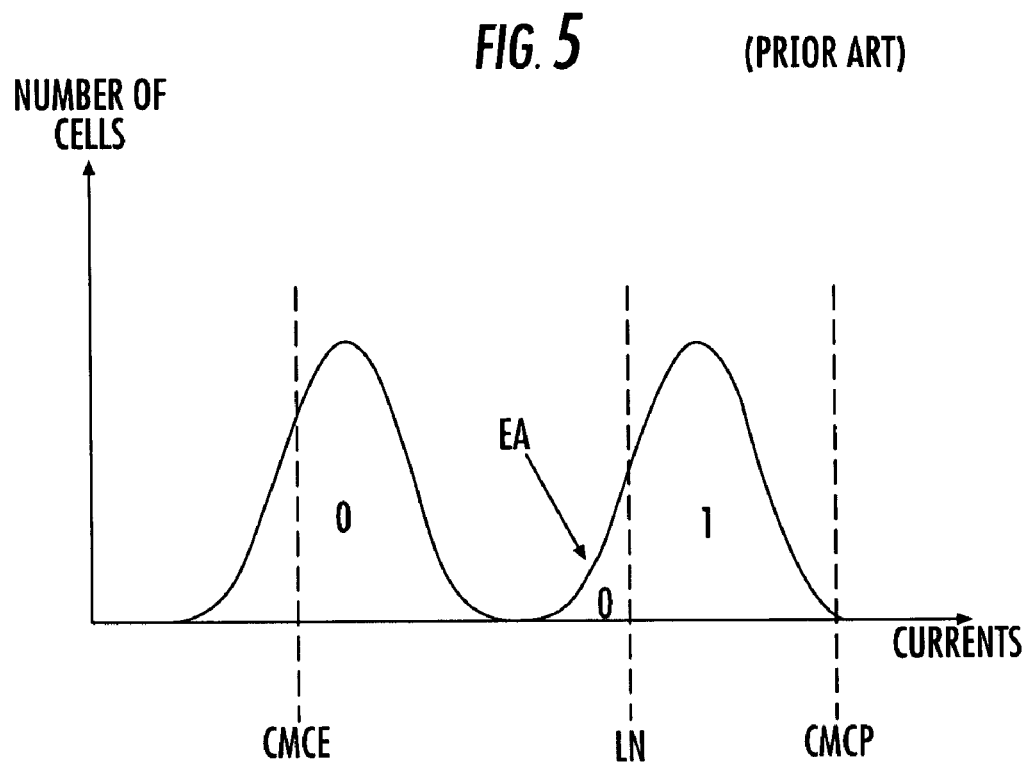
FIG. 5 illustrates an exemplary distribution of the currents of memory cells after degradation of their initial state according to the prior art.

Within the framework of nonvolatile memories, for example, the mechanisms of degradation of the integrity of the data, like perturbations due to reads or repeated programmings of the memory plane, or the loss of charge stored in a floating gate, induce a shifting of the distributions of the currents of the cells over time. These drifts may be sufficiently significant to produce erroneous readings of certain cells which have, for the reading system, undergone a change of state as shown by FIG. 5. Stated otherwise, when the current Icell decreases due to one or other of these drifts, the difference between Iref and Icell decreases and the node OUT discharges before the data item is taken into consideration (recorded) by the signal LTEN. This then results in erroneous reading of the cell. In FIG. 5, the reference EA designates the set of cells that are read as being virgin instead of being read as being programmed.

Error correcting codes of SEC-DED type, which are easily integratable, make it possible to correct erroneous reads, but only up to a single error per code block of n=k+r data items. On the other hand, Error detecting only codes, for example cyclic redundancy codes of the CRC type, make it possible to detect one or more errors, but without being able to correct them.

Figure 6:
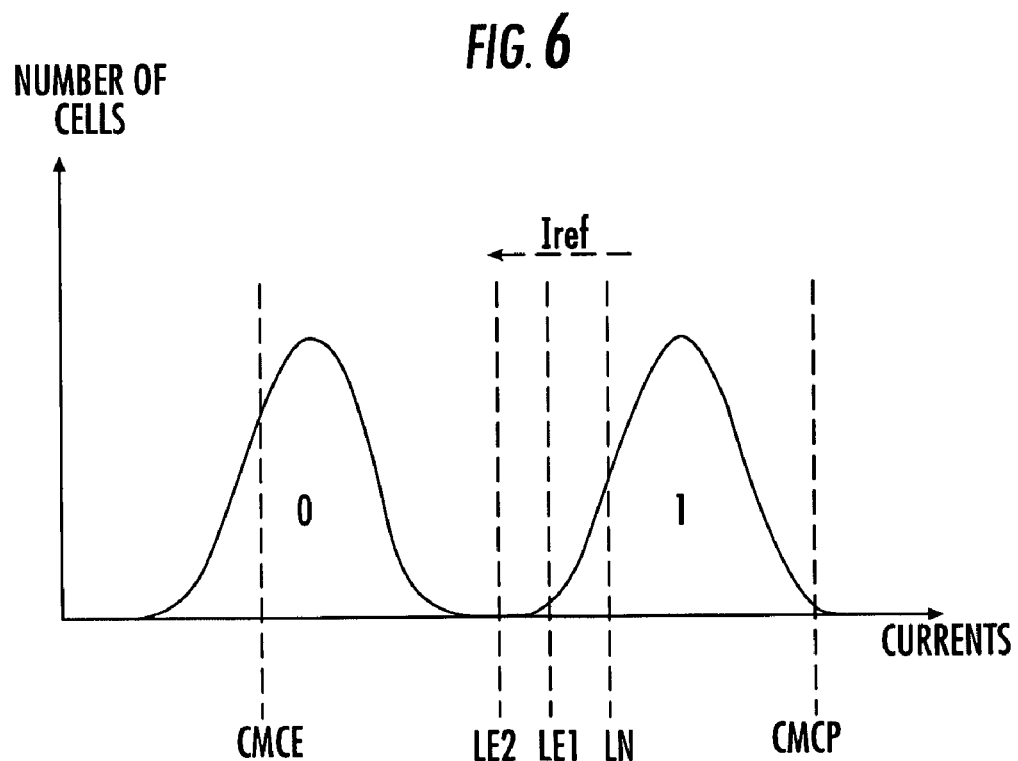
FIG. 6 illustrates successive modifications of the reference current for the reading of the data stored in the memory according to a first embodiment of the invention.

An object of the invention is aimed at carrying out several error detections-corrections for the n data items of the code block, obtained by modifying the level of the reference current Iref. For example, FIG. 6 illustrates a first embodiment of such a correction system in the case where the mechanism of degradation of the data by loss of charge is significant and leads in particular to a shift in the population of the cells. Such is the case in particular for floating gate nonvolatile memories.

Thus, a first read is carried out with the reference level LN corresponding to a normal read. The set of n elements of the code block thus read provides a first result. If the detection code indicates the presence of an error, a second read using a reference level LE1 that is less than the level LN is carried out. With the read reference current being lower, the number of errors decreases. Also, these operations are iteratively repeated while decreasing the reference current Iref with each iteration until a chosen final number of errors is obtained. In the example illustrated in FIG. 6, for the reference current level LE2, the number of errors is reduced to zero and the integrity of the information is retrieved.

Figure 7:
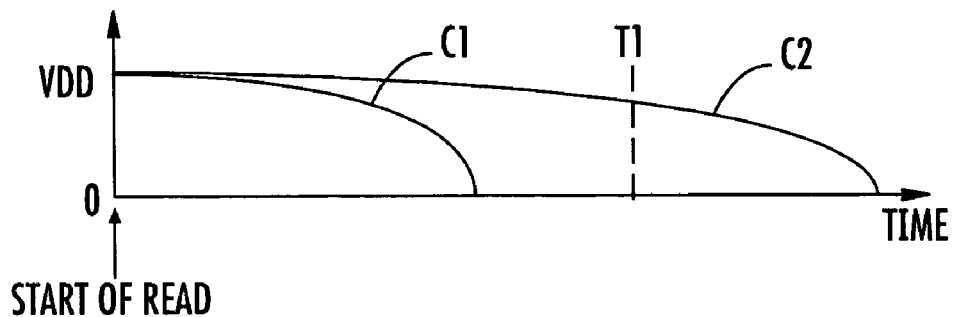
FIG. 7 illustrates a modification of the reference current for the reading of the data stored in the memory according to the invention.

FIG. 7 illustrates this first embodiment of the invention differently. In FIG. 7, curve C1 represents the profile of the voltage of the node OUT with a reference current having the standard reference level LN. It is seen that the instant T1 at which the recording in the flip-flop MV is performed, the read using the level LN for the current Iref leads to the reading of a "0" instead of the reading of a "1". By decreasing the reference current so as to give it the value LE2, the discharge time is longer (curve C2) and the correct value of read is obtained.

Care should be taken not to decrease the level of the reference current too significantly since in this case it is possible that the code may detect an error due to a virgin cell which is read as a programmed cell. The person skilled in the art will be able to adjust the value of the notches for modifying the reference current as a function in particular of the characterization data of the memory tested which provide indications regarding especially the drifting of the distributions of current and/or regarding losses of charge.

By way of indication, for a MRAM memory, the level LN is equal to 15 µA, and a notch or amount equal to 1 µA will be chosen, for example. When the code used is an error detecting only code, for example a CRC code, the minimum reference current LE2 must be correctly determined so as not to reach virgin cells.

In the case where the code used is an error detecting and correcting code, for example a simple code of the SEC-DED type, it is possible to decrease the reference current until it reaches a level for which a single residual error is detected. Specifically, in this case, this lone residual error will be correctable by the decoder.

Additionally, in the case where the population of the virgin cells and the population of the programmed cells overlap, it is not possible to obtain a number of detected errors which is equal to zero, regardless of the value of the reference current. Thus, in this case, the use of an error detecting and correcting code of the SEC-DED type for example will preferably be chosen, and the value of the reference current will be adjusted until a single residual error is detected, which will be corrected. Thereafter, it will be possible to again read the code block thus corrected and which will previously also have been encoded with a code of the CRC type, so as to confirm through the CRC code that there is no longer any residual error.

Of course, what was described with reference to FIGS. 6 and 7 in respect to the reference levels decreasing from LN to LE2, also applies in the case where the degradation of the data is due chiefly to disturbances through reading or programming which lead to a shifting of the distribution of the currents of the virgin cells towards higher currents. In this case, the reads following the one performed with the reference level LN are performed with reference current levels LP that are greater than the level LN.

Figure 8:
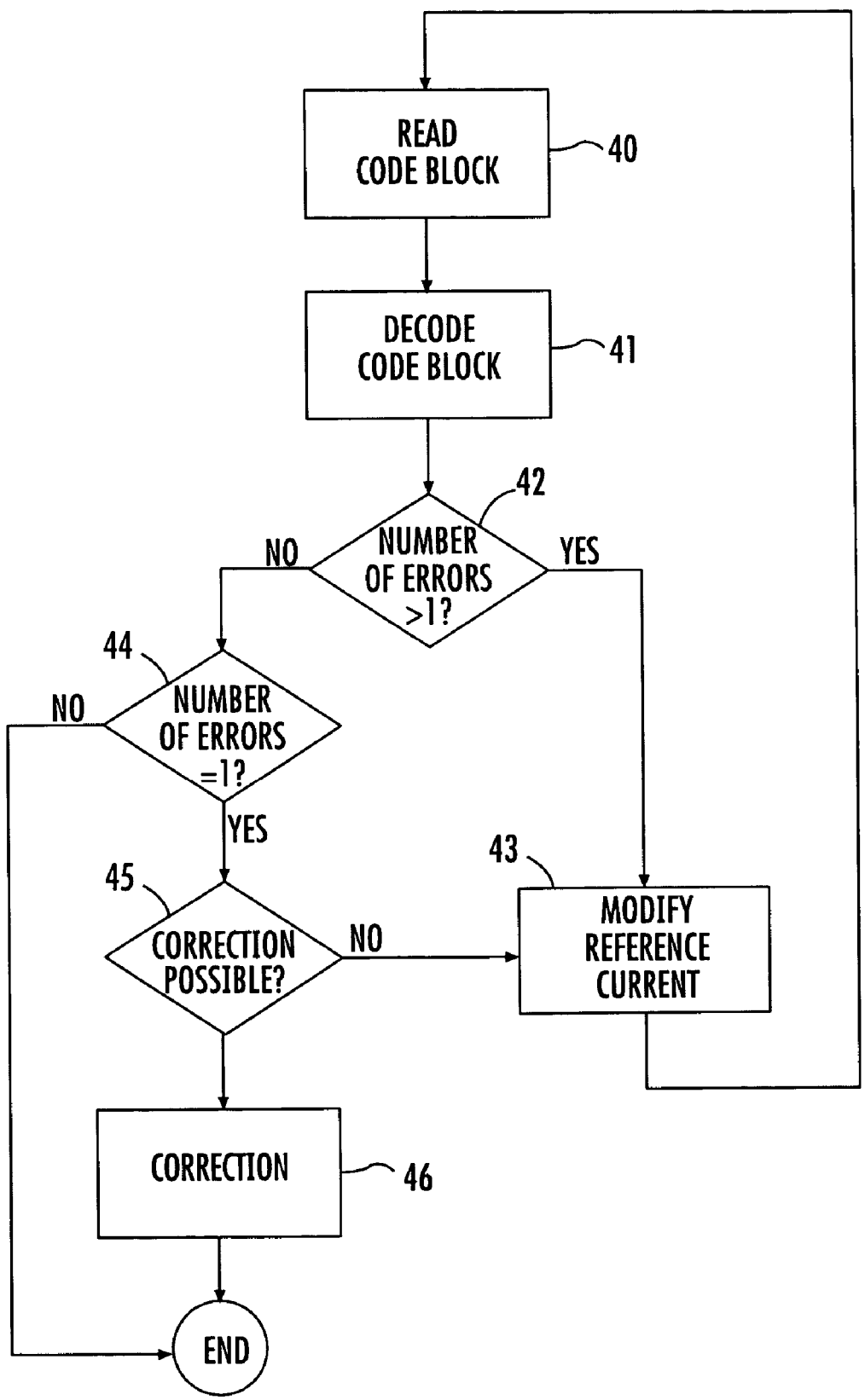
FIG. 8 is a flowchart of a method according to the first embodiment of the invention.

A flowchart of a mode of implementation of a method aspect of the invention is represented in FIG. 8. More precisely, the reading of a code block 40 is followed by the decoding of the code block 41. If the number of errors is greater than 1 (step 42), then the reference current is modified (step 43) and the reading of the code block is begun again.

If the number of errors is less than or equal to 1, two cases are possible. Either the number of errors is equal to 1, or it is equal to zero. If the number of errors is equal to 1, and if the code used allows a correction of the error (steps 44 and 45), as is the case for an SEC-DED code, the correction is performed (step 46). If on the other hand the correction is not possible (steps 44 and 45), for example because a CRC code has been used, then the reference current is modified again (step 43) and the reading of the code block is begun again so as to obtain a final number of errors that is equal to zero.

Figure 9:
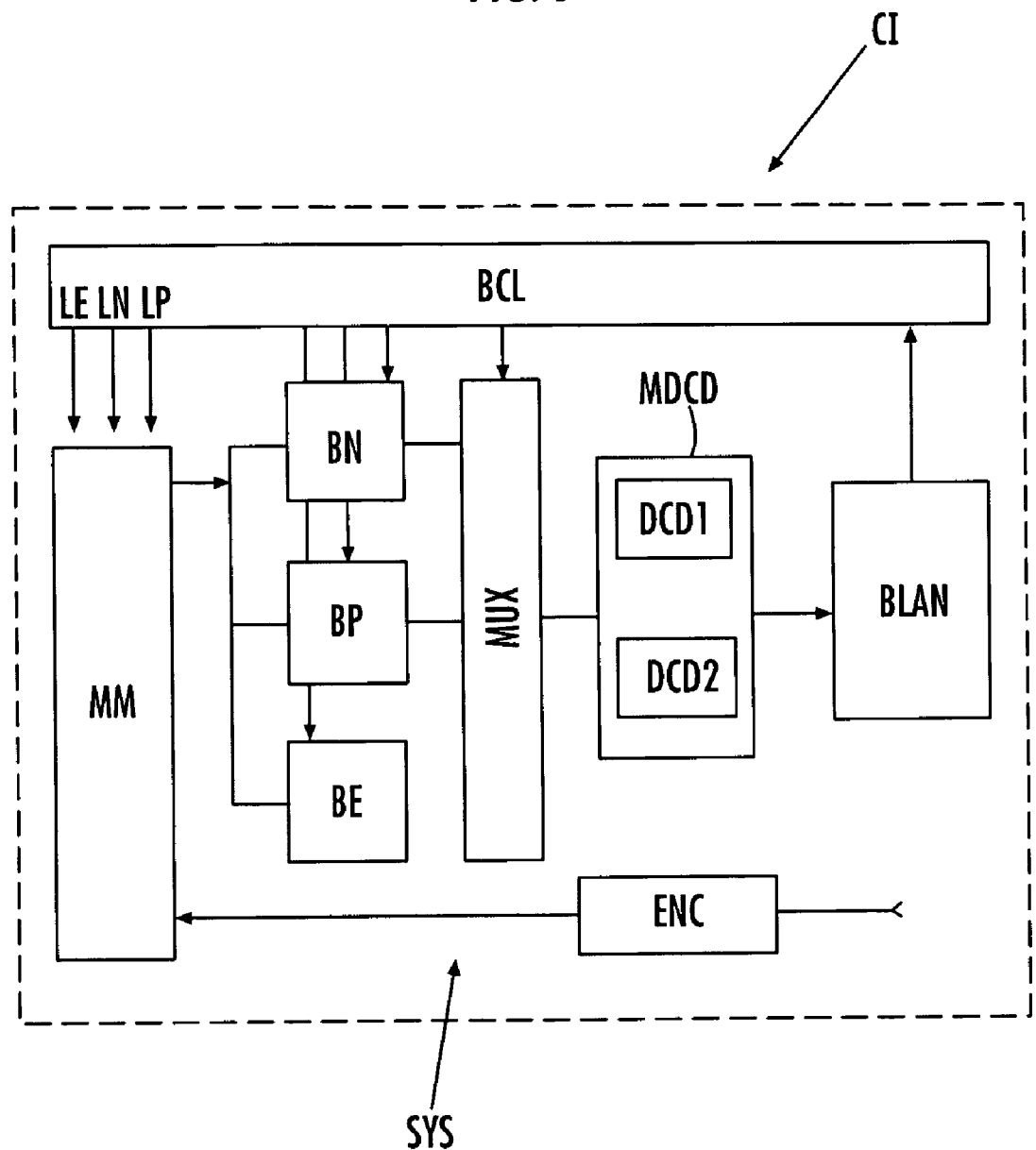
FIG. 9 is a schematic block diagram illustrating a first embodiment of an integrated device according to the invention.

FIG. 9 presents the block diagram of an integrated circuit CI incorporating an error detection and correction system SYS according to the invention, assigned to a memory MM. The system SYS comprises an encoder ENC capable of encoding the data intended to be stored in the memory MM using an appropriate code.

According to the type of application envisaged, in particular according to the type of memory used, the encoding means ENC may comprise for example either only an encoder capable of encoding the data, using a code of the SEC-DED type, or only an encoder block capable of encoding the data using a cyclic redundancy code, or else both of the aforementioned encoder blocks. In the latter case, according to an exemplary embodiment, the data will for example be encoded first using the CRC code, then the whole set of data thus coded will in its turn be coded using a code of the SEC-DED type.

The various levels LE, LN and LP of the reference current are delivered to the reading module or reading means (for example of the type of those illustrated in FIG. 1) of the memory by a controller or control means BCL. The corresponding results of the read are stored in buffer memories BN, BP and BE (analogous to the flip-flop MV of FIG. 1) linked to a decoder or decoding means MCD by way of a multiplexer MUX, also driven by the control means BCL.

The decoding means MDCD exhibit an architecture analogous to that of the encoder or encoding means ENC. Thus, they may comprise, as the case may be, either a first decoder DCD1 capable of performing the successive decodings, if any, with the SEC-DED code, or a second decoder DCD2 capable of performing the successive decodings, if any, with the CRC code, or both decoders DCD1 and DCD2.

The information representative of the residual numbers of errors are then processed by an analysis block BLAN. The analysis block BLAN and the control block BCL form a drive module or drive means, embodied for example by means of logic gates and logic circuits on the basis of logic synthesis algorithms. These drive means will be able to iteratively activate the reading and decoding means after having modified the values of the reference currents. In the case where the data have been doubly encoded with firstly an SEC-DED code and then with a CRC code, the drive means will firstly activate the first decoder DCD1 then, once the error has been corrected, the decoder DCD2.

Figure 10:
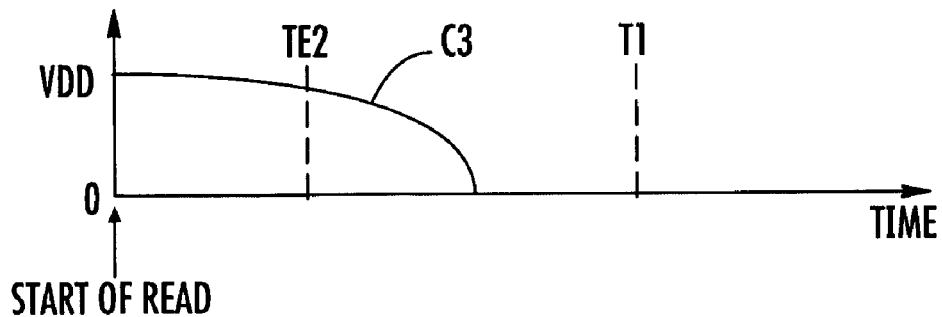
FIG. 10 illustrates a modification of the duration of reading of the data stored in the memory according to a second embodiment of the invention.

The invention is not limited to the modes of implementation and embodiments just described. Specifically according to a second embodiment of the invention, the instant T1 of consideration of the result of the comparison, that is to say the duration of reading, is modified as read parameter, rather than the reference current. This is illustrated in FIG. 10. In this figure, curve C3 represents the profile of the voltage of the node OUT of a programmed cell (logic "1") degraded during a read with a reference current Iref having the standard level LN.

It is seen that by taking into consideration the result of the comparison at the standard instant T1, a logic "0" is obtained, that is to say an erroneous reading result. On the other hand by decreasing the duration of read, that is to say by performing the recording of the result of the comparison at earlier instants TE, for example at the instant TE2, this reading error is eliminated.

Care should be taken not to decrease the duration of reading too significantly so as to prevent the code from detecting an error due to a virgin cell which is read as a programmed cell. The person skilled in the art will be able to adjust the value of the notches for modifying the duration of read as a function in particular of the characterization data of the memory tested which provide indications especially regarding the drifting of the distributions of current and/or regarding the losses of charge retention. By way of indication, for an MRAM memory, the standard duration T1 of the read is equal to 30 ns, and a notch or amount equal to 5 ns will be chosen, for example.

Of course, what has been described with respect to durations decreasing from T1 to TE2 also applies in the case where the degradation of the data is due chiefly to disturbances through reading or programming which lead to a shifting of the distribution of the currents of the virgin cells towards higher currents. In this case, the reads following the one performed at the standard instant T1 are performed at instants TP subsequent to the instant T1, that is to say with longer reading durations.

Figure 11:
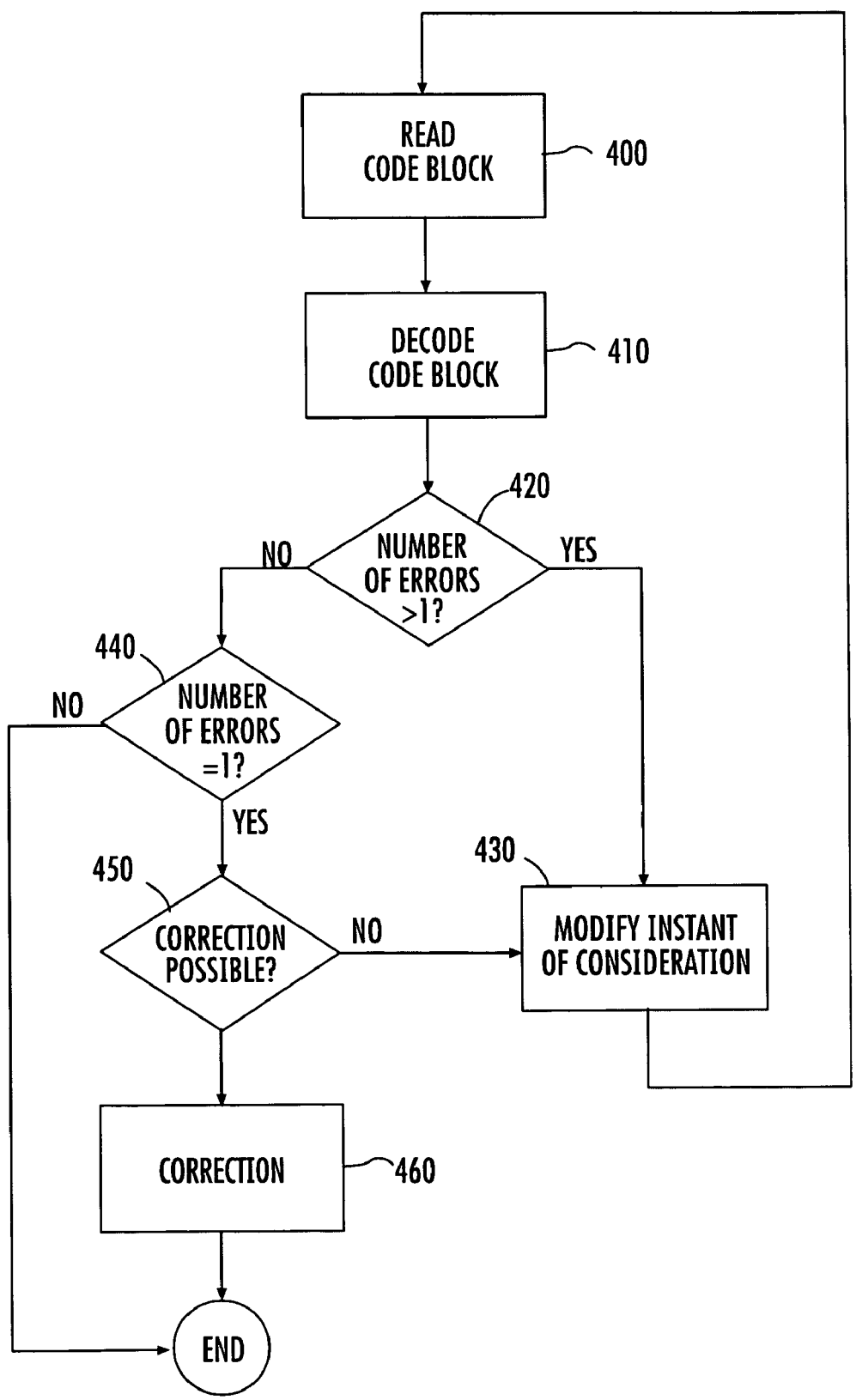
FIG. 11 is a flowchart of a method according to the second embodiment of the invention.

A flowchart of the method aspect of the invention in accordance with this embodiment is represented in FIG. 11. In this figure, the reference characters of the steps that are identical or analogous to those represented in FIG. 8 are multiplied by 10 with respect to the reference characters of FIG. 8. Only the differences between FIGS. 8 and 11 will now be described. In fact the only difference between these two figures resides in the fact that step 430 of FIG. 11 makes provision not for a modification of the reference current but for a modification of the instant of consideration of the result of the comparison in the read operation.

Figure 12:
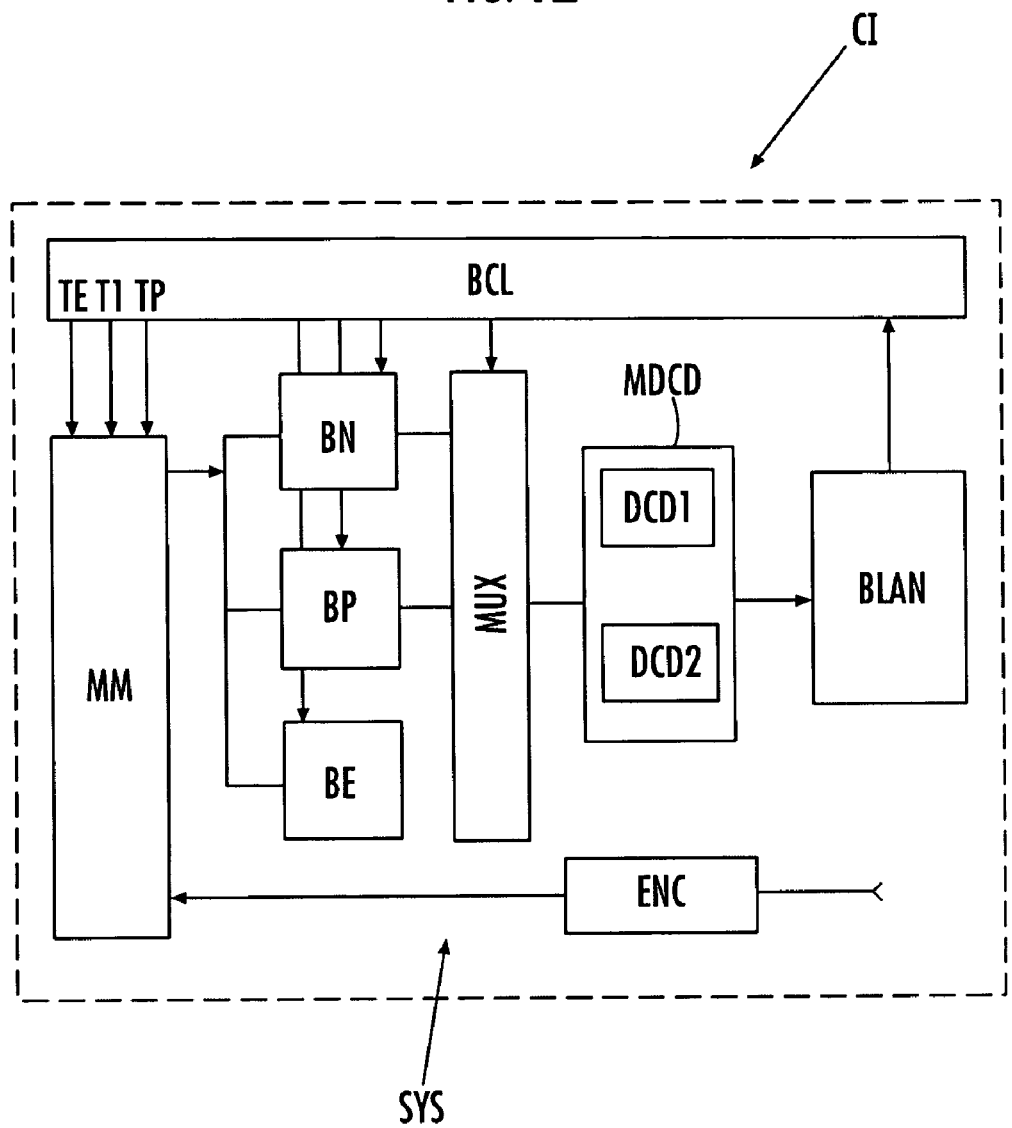
FIG. 12 is a schematic block diagram illustrating a second embodiment of an integrated device according to the invention.

FIG. 12 presents the block diagram of an integrated circuit C1 incorporating a system SYS for detecting and correcting errors according to this second embodiment of the invention, assigned to a memory MM. A difference between the system of FIG. 12 and the system of FIG. 9 resides in that this time it is the various instants TE, T1, TP etc. of consideration of the results of the comparison during the reading operation which are delivered to the means of reading (for example of the type of those illustrated in FIG. 1) of the memory by the control means BCL. Additionally the drive means will be able to iteratively activate the reading and decoding means after having modified the values of the instants of consideration, that is to say the durations of the reading.

Although the two embodiments of the invention have been discussed separately, there is nothing to exclude them from being combined, that is to say from choosing to modify at one and the same time, for example sequentially in any order, the value of the reference current and the value of the instant of recording of the data item. Thus it would be possible to envisage modifying firstly the reference current using a coarse notch, and then to refine the process by modifying the instant of recording using a fine notch, for example.

In a system according to such an embodiment, the levels LE, LN, LP of the reference currents and the instants TE, T1, TP are delivered to the reading means. Also, the drive means will be able to iteratively activate the reading and decoding means after having modified the values of the reference current and/or the values of the instants of consideration, that is to say the reading durations.

Regardless of the embodiments envisaged, the invention makes it possible, with the use of a cyclic redundancy code (CRC) to embody a system that is very efficient in terms of error correction with a reliability that is recognized to be greater than 99% and to do so for a very low area cost. Additionally, the solution proposed with the combined integration of a cyclic redundancy code (CRC) and of an error detecting and correcting code, for example of the SEC-DED type, leads to the obtaining of an error detecting-correcting circuit which improves the integrity of the information stored with great reliability without appreciable overhead relative to existing solutions.

Of course, depending on the type of obligation and the nature of the defects to be corrected, the embodiment of the circuit will be realized with one type of code rather than another. Thus, in the case of a nonvolatile memory with storage by floating gate, for example, where degradation of the information arises equally by modification of the currents of the cells on account of the disturbances caused by the reading or programming phases, as on account of a long period of nonuse of the memory during which there is reduction of the currents of the programmed cells, a system integrating a code of CRC type and a code of the SEC-DED type would be chosen. On the other hand, for other memories such as magnetic memories (MRAMs), in which an identical temporal drifting of the populations of the virgin and programmed cells is observed, a solution with a cyclic redundancy code, of the CRC type, alone, is sufficient to meet the error detection-correction requirements.

That which is claimed is:

1. A method of detecting and correcting errors for a memory storing at least one code block comprising information data and control data, the method comprising:
   reading and decoding the at least one code block by comparing a reference current value with a current value generated by a memory cell to generate an information item representative of a number of errors in the at least one code block; and
   when the number of errors exceeds a threshold, modifying the reference current value, and performing a reading and decoding of the at least one code block again to obtain a new error information item.

2. The method according to claim 1 further comprising repeating the reading, decoding, and modifying until a final number of errors is not greater than one.

3. The method according to claim 1 wherein the at least one code block is encoded with an error detecting only code and then with an error detecting and correcting code, and successive decodings are performed with the error detecting and correcting code until the number of errors equals one, then a residual error is corrected, and an absence of error is confirmed by reading the at least one code block thus corrected, followed by a decoding using the error detecting only code.

4. The method according to claim 1 wherein the memory comprises a floating gate nonvolatile memory.

5. The method according to claim 1 wherein the memory comprises a magnetic nonvolatile memory.

6. The method according to claim 1 wherein the at least one code block is encoded with an error detecting and correcting code, and a final number of errors is equal to one.

7. The method according to claim 6 wherein the error detecting and correcting code comprises a code capable of correcting an error and of detecting two errors.

8. The method according to claim 1 wherein the at least one code block is encoded with an error detecting only code, and a final number of errors is equal to zero.

9. The method according to claim 8 wherein the error correcting only code comprises a CRC code.

10. A circuit for detecting and correcting errors located in an integrated circuit memory that stores at least one code block having information data and control data, the circuit comprising:
    a reading module for reading the at least one code block and comprising a comparator for comparing a reference current value with a current value generated by a memory cell;
    a decoder for decoding the at least one code block and for delivering an information item representative of a number of errors in the at least one code block; and
    a drive module for modifying the reference current value, and for activating said reading module and said decoder to respectively read and decode the at least one code block thereby obtaining a new error information item when the number of errors exceeds one.

11. The circuit of claim 10 wherein said drive module repeats the modifying and activating until a final number of errors is not greater than one.

12. The circuit of claim 10 wherein the at least one code block is encoded with an error detecting and correcting code, and a final number of errors is equal to one.

13. The circuit of claim 10 wherein the at least one code block is encoded with an error detecting only code and then with an error detecting and correcting code; and wherein said decoder comprises:
    a first decoder for performing successive decodings with the error detecting and correcting code until a final number of errors equals one, and for correcting any residual error, and
    a second decoder for decoding the at least one code block thus corrected using the error detecting only code.

14. The circuit of claim 12 wherein the error detecting and correcting code comprises a code for correcting an error and detecting two errors.

15. The circuit of claim 10 wherein the at least one code block is encoded with an error detecting only code, and a final number of errors is equal to zero.

16. The circuit of claim 15 wherein the error correcting only code comprises a CRC code.

17. A circuit for detecting and correcting errors located in an integrated circuit memory that stores at least one code block having information data and control data, and the at least one code block is encoded with at least one of an error detecting only code and an error detecting and correcting code, the circuit comprising:
    a reading module for reading the at least one code block;
    a decoder for decoding the at least one code block and for delivering an information item representative of a number of errors in the at least one code block, said decoder comprising
    a first decoder for performing successive decodings with the error detecting and correcting code until a final number of errors equals one, and for correcting any residual error, and
    a second decoder for decoding the at least one code block thus corrected using the error detecting only code; and
    a drive module for modifying at least one parameter of said reading module by a value, and for activating said reading module and said decoder to respectively read and decode the at least one code block thereby obtaining a new error information item when the number of errors exceeds one, and said drive module repeats the modifying and activating until the final number of errors is not greater than one.

18. The circuit of claim 17 wherein said reading module comprises a comparator for comparing a reference current value with a current value generated by a memory cell for a duration of time; and wherein said drive module modifies the reference current value by a amount.

19. The circuit of claim 17 wherein said reading module comprises a comparator for comparing a reference current value with a current value generated by a memory cell for a duration of time; and wherein said drive module modifies the duration of time by an amount.

20. The circuit of claim 17 wherein the at least one code block is encoded with an error detecting only code, and a final number of errors is equal to zero.

21. The circuit of claim 17 wherein the at least one code block is encoded with an error detecting and correcting code, and a final number of errors is equal to one.

22. The circuit of claim 21 wherein the error detecting and correcting code comprises a code for correcting an error and detecting two errors.

23. A method of detecting and correcting errors for a memory storing at least one code block comprising information data and control data, the method comprising:
   reading and decoding the at least one code block comparing a reference current value with a current value generated by a memory for a duration of time to generate an information item representative of a number of errors in the at least one code block; and
   when the number of errors exceeds a threshold, modifying the duration of time, and performing a reading and decoding of the at least one code block again to obtain a new error information item.

24. The method according to claim 23 further comprising repeating the reading, decoding, and modifying until a final number of errors is not greater than one.

25. The method according to claim 23 wherein the at least one code block is encoded with an error detecting and correcting code, and a final number of errors is equal to one.

26. The method according to claim 23 wherein the at least one code block is encoded with an error detecting only code, and a final number of errors is equal to zero.

27. A circuit for detecting and correcting errors located in an integrated circuit memory that stores at least one code block having information data and control data, the circuit comprising:
   a reading module for reading the at least one code block and comprising a comparator for comparing a reference current value with a current value generated by a memory cell for a duration of time;
   a decoder for decoding the at least one code block and for delivering an information item representative of a number of errors in the at least one code block; and
   a drive module for modifying the duration of time, and for activating said reading module and said decoder to respectively read and decode the at least one code block thereby obtaining a new error information item when the number of errors exceeds one.

28. The circuit of claim 27 wherein said drive module repeats the modifying and activating until a final number of errors is not greater than one.

29. The circuit of claim 27 wherein the at least one code block is encoded with an error detecting and correcting code, and a final number of errors is equal to one.

30. The circuit of claim 27 wherein the at least one code block is encoded with an error detecting only code, and a final number of errors is equal to zero.

* * * * *